(12) United States Patent
Takahashi et al.

(10) Patent No.: US 8,525,608 B2
(45) Date of Patent: Sep. 3, 2013

(54) PLL FREQUENCY SYNTHESIZER

(75) Inventors: Kenji Takahashi, Miyagi (JP); Hidetoshi Yamasaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/319,221

(22) PCT Filed: May 11, 2010

(86) PCT No.: PCT/JP2010/003197
§ 371 (c)(1),
(2), (4) Date: Jan. 30, 2012

(87) PCT Pub. No.: WO2010/134287
PCT Pub. Date: Nov. 25, 2010

(65) Prior Publication Data
US 2012/0119839 A1    May 17, 2012

(30) Foreign Application Priority Data

May 22, 2009 (JP) .................................. 2009-124600

(51) Int. Cl.
*H03B 5/12*    (2006.01)

(52) U.S. Cl.
USPC ............... 331/177 V; 331/16; 331/34; 331/17

(58) Field of Classification Search
USPC .................... 331/16, 34, 177 V, 17
See application file for complete search history.

(56) References Cited

U.S. PATENT DOCUMENTS

| | | | |
|---|---|---|---|
| 6,429,693 B1 | 8/2002 | Staszewski et al. | |
| 7,696,830 B2 * | 4/2010 | Ohara et al. | 331/17 |
| 2002/0159555 A1 | 10/2002 | Staszewski et al. | |
| 2003/0227341 A1 | 12/2003 | Sawada | |
| 2007/0176663 A1 | 8/2007 | Bisanti et al. | |
| 2007/0183014 A1 | 8/2007 | Coppola et al. | |

FOREIGN PATENT DOCUMENTS

| | | |
|---|---|---|
| JP | 2002-76886 | 3/2002 |
| JP | 2004-15387 | 1/2004 |
| JP | 2009-504063 | 1/2009 |

OTHER PUBLICATIONS

International Search Report, mailed Jul. 13, 2010, for corresponding International Patent Application No. PCT/JP2010/003197.

* cited by examiner

*Primary Examiner* — Arnold Kinkead (74) *Attorney, Agent, or Firm* — Greenblum & Bernstein, P.L.C.

(57) ABSTRACT

A PLL frequency synthesizer provides improved phase noise characteristics. In an ADPLL frequency synthesizer, a frequency characteristic adjusting unit compares a predetermined threshold to the difference between the fractional portion of a DCO control signal and the closest integer value, and generates an adjustment signal. A supplementary varactor shifts the oscillating frequency characteristics based on the adjustment signal. By setting the predetermined threshold to a value defining the range in which the possibility of incrementing or decrementing is high, the oscillating frequency characteristics are shifted in cases when the target value of the fractional portion of the DCO control signal is in the range in which the possibility of incrementing or decrementing is high. By shifting the oscillating frequency characteristics, the target value of the fractional portion of the DCO control signal are shifted to a range in which the possibility of incrementing or decrementing is low.

8 Claims, 7 Drawing Sheets

PLL FREQUENCY SYNTHESIZER

TECHNICAL FIELD

The present invention relates to a PLL frequency synthesizer used for a radio communication apparatus and radio measurement instrument or the like.

BACKGROUND ART

Figure 1:
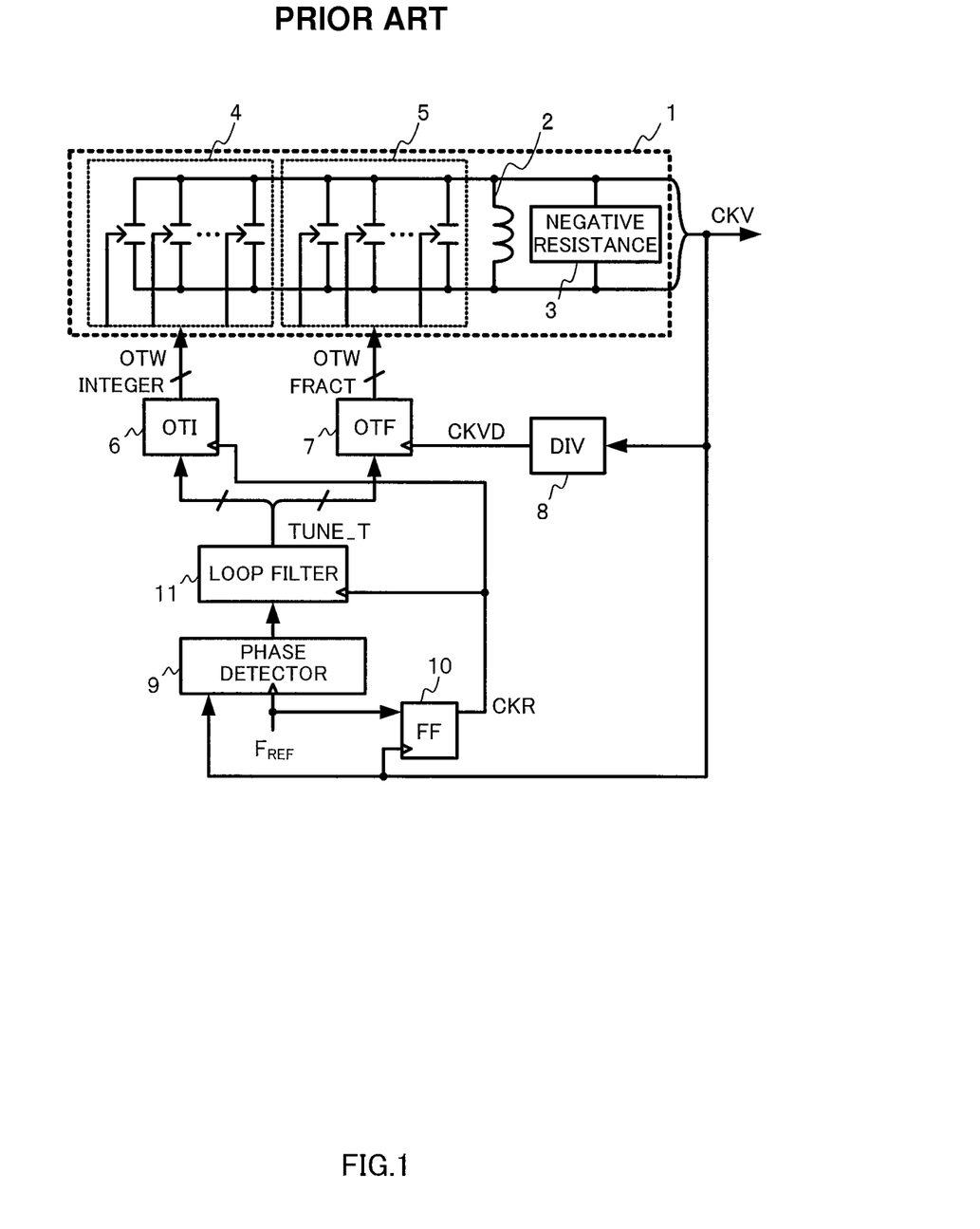
FIG. 1 is a diagram showing a configuration of a conventional ADPLL frequency synthesizer.

ADPLL (All-Digital Phase-Locked Loop) frequency synthesizers are conventionally available, which are provided with a digitally controlled oscillator (DCO) and use dithering by a ΔΣ modulator to improve frequency resolution. This type of ADPLL frequency synthesizer is disclosed, for example, in Patent Literature 1. FIG. 1 is a diagram showing a configuration of the conventional ADPLL frequency synthesizer disclosed in Patent Literature 1.

In FIG. 1, digitally controlled oscillator (DCO) 1 is made up of inductor element 2, negative resistance element 3, varactor array 4 and varactor array 5. Varactor array 4 and varactor array 5 each have a plurality of varactors. All the varactors have the same capacitance. The capacitance value of each varactor is controlled by binary control signals. The capacitance value of the varactor is controlled, and an oscillating frequency fCKV of DCO 1 is thereby controlled.

The oscillating frequency fCKV is expressed by equation 1 using a total capacitance value C of varactor array 4 and varactor array 5 and an inductance value L of inductor element 2.

(Equation 1)

$$f_{CKV} = \frac{1}{2\pi\sqrt{LC}} \quad [1]$$

To be more specific, the capacitance value of the varactor is controlled as follows. First, phase comparator 9 compares the phase of a reference signal FREF and the phase of an output CKV of DCO 1 and generates a phase error signal. Loop filter 11 then filters the phase error signal and outputs the filtered phase error signal as a DCO control signal TUNE_T. The TUNE_T signal is made up of an integer part and a fraction part. The integer part is inputted to tracking varactor control section 6 and the fraction part is inputted to tracking varactor control section 7.

Tracking varactor control section 6 converts the integer part to an OTW (Oscillator Tuning Word) integer signal and outputs this OTW integer signal to varactor array 4 and thereby adjusts the capacitance of varactor array 4. On the other hand, tracking varactor control section 7 converts the fraction part to an OTW fract signal and outputs the OTW fract signal to varactor array 5 and thereby adjusts the capacitance of varactor array 5. Tracking varactor control section 7 includes a ΔΣ (delta-sigma) modulator.

As described above, the conventional ADPLL frequency synthesizer constitutes a negative feedback system and performs PLL (Phase Locked Loop) operation.

By the way, tracking varactor control section 6 operates in synchronization with a CKR clock which is a signal resulting from returning the reference signal FREF with the CKV and tracking varactor control section 7 operates in synchronization with a CKVD clock which is a signal resulting from frequency-dividing the CKV using frequency divider 8. The CKVD frequency is set to be sufficiently larger than the CKR frequency. This allows the ΔΣ modulator of tracking varactor control section 7 to obtain a dithering effect and improves the frequency resolution of the CKV signal.

CITATION LIST

Patent Literature
PTL 1
US Patent Application Publication No. 2002/0159555

SUMMARY OF INVENTION

Technical Problem

However, since the clock signal CKR is asynchronous with the clock signal CKVD in the above described conventional ADPLL frequency synthesizer, the change timing of the OTW integer signal normally mismatches the change timing of the OTW fract signal. Therefore, even when the value of the DCO control signal TUNE_T approximates to a target value of the DCO control signal TUNE_T corresponding to a target oscillating frequency, if the target value is close to an integer value, a phenomenon occurs in which the difference between the target value of TUNE_T and OTW (Total) which is the sum of OTW integer and OTW fract temporarily increases. The repeated occurrence of this phenomenon results in a problem that a phase noise characteristic of the ADPLL frequency synthesizer deteriorates.

For example, suppose a state in which the target value of the TUNE_T is 252.06 which is close to integer value 252 and the actual value of the TUNE_T at a certain rising time of the CKR is 251.99. In this state, the value of the OTW integer is, for example, 250 and the value of the OTW fract is 1.99. When a ΔΣ modulator which outputs one of values 0, 1, 2 and 3 is used, the output of the ΔΣ modulator virtually fluctuates to take one of values 1, 2 and 3 so as to set the average value of the OTW fract to 1.99. Thus, the error between the target value of the TUNE_T and the average value of OTW (total) which is the sum of the OTW integer and OTW fract becomes approximately 0.

When the actual value of the TUNE_T changes from this state to, for example, 252.02, a "carry" takes place. Here, "carry" means that the value of the integer part of the actual value of the TUNE_T is incremented by 1. On the other hand, "borrow" means that the value of the integer part of the actual value of the TUNE_T is decremented by 1.

In synchronization with the CKVD immediately after this carry, to make the average value 1.02, the output of the ΔΣ modulator (that is, OTW fract) changes from a state in which it virtually fluctuates to take one of values of 1, 2 and 3 to a state in which it virtually fluctuates to take one of values of 0, 1 and 2. On the other hand, the value of the OTW integer changes from 250 to 251 lagging behind the change timing of the OTW fract resulting from the difference in frequency between clock signals.

Therefore, the state in which the value of the OTW integer is shifted by 1 from the integer value of the TUNE_T continues for a while after a change of the fluctuating state of the OTW fract value occurs, and as a result, the error between the target value of the TUNE_T and the OTW (total) temporarily increases.

Such a phenomenon that the error between the target value of the TUNE_T and the OTW (total) temporarily increases can also occur when a "borrow" takes place. For example, suppose a state in which the target value of the TUNE_T is 252.06 close to integer value 252 and the actual value of the TUNE_T at a certain rising time of the CKR is 252.02. In this state, the value of the OTW integer is, for example, 251 and the value of the OTW fract is 1.02. When a ΔΣ modulator that outputs one of values 0, 1, 2 and 3 is used, to make the average value of the OTW fract 1.02, the output of the ΔΣ modulator virtually fluctuates to take one of values 0, 1 and 2. Thus, the error between the target value of the TUNE_T and the average value of the OTW (total) which is the sum of the OTW integer and the OTW fract becomes approximately 0.

When the actual value of the TUNE_T changes from this state to, for example, 251.99, a "borrow" takes place.

In synchronization with the CKVD immediately after this borrow, to make the average value 1.99, the output of the ΔΣ modulator (that is, OTW fract) changes from a state of virtually fluctuating to take one of values 0, 1 and 2 to a state of virtually fluctuating to take one of values 1, 2 and 3. On the other hand, the value of the OTW integer changes from 251 to 250 lagging behind the change timing of the OTW fract resulting from the difference in frequency between clock signals.

Therefore, the state in which the value of the OTW integer is shifted by 1 from the integer value of the TUNE_T continues for a while after a change of the fluctuating state of the OTW fract value occurs, and as a result, the error between the target value of the TUNE_T and the OTW (total) temporarily increases.

As described above, when the target value is close to an integer value, a phenomenon occurs in which the error between the target value of the TUNE_T and the OTW (total) which is the sum of the OTW integer and the OTW fract temporarily increases, and as a result, phase noise characteristics of the ADPLL frequency synthesizer deteriorates.

The present invention has been implemented in view of such problems and it is an object of the present invention to provide a PLL frequency synthesizer that improves phase noise characteristics.

Solution to Problem

A PLL frequency synthesizer according to the present invention has: an oscillation section that includes a first capacitance element group made up of a plurality of variable capacitance elements and a second capacitance element group made up of a plurality of variable capacitance elements; and an oscillating frequency control section that controls an output frequency of the oscillation section by generating a phase error signal corresponding to a difference between a phase of an output signal of the oscillation section and a phase of a reference signal, controlling a capacitance value of the first capacitance element group using an integer part of the phase error signal, and controlling a capacitance value of the second capacitance element group using a fraction part of the phase error signal, and this PLL frequency synthesizer adopts a configuration having: an adjustment signal generation section that generates an adjustment signal based on a result of a comparison between a difference between the value of the fraction part and an integer value closest to the value of the fraction part and a predetermined threshold; and a frequency characteristic shifting section provided in the oscillation section that shifts an oscillating frequency characteristic of the oscillation section based on the adjustment signal.

Advantageous Effects of Invention

According to the present invention, it is possible to provide a PLL frequency synthesizer that can improve a phase noise characteristic.

BRIEF DESCRIPTION OF DRAWINGS

FIG. 5A-FIG.5F are diagrams showing a simulation result of the operation of the ADPLL frequency synthesizer;

FIG. FIG. 6A-FIG.6F are an enlarged view of a time zone in FIG. 5A-FIG.5F where a carry or borrow occurs;

FIG.

DESCRIPTION OF EMBODIMENT

Hereinafter, an embodiment of the present invention will be described in detail with reference to the accompanying drawings. The same components in the embodiment will be assigned the same reference numerals and overlapping descriptions thereof will be omitted.

Figure 2:
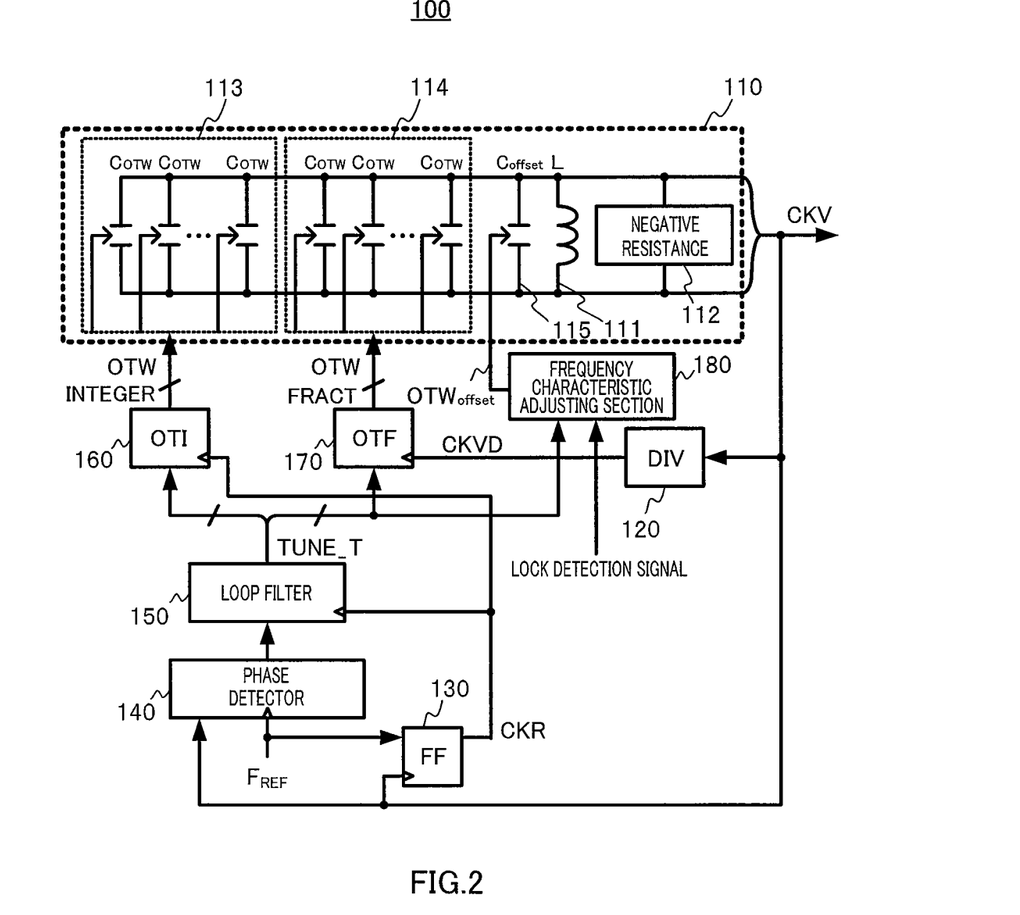
FIG. 2 is a block diagram showing a schematic configuration of an ADPLL frequency synthesizer according to an embodiment of the present invention.

FIG. 2 is a block diagram showing a schematic configuration of an ADPLL frequency synthesizer according to an embodiment of the present invention. In FIG. 2, ADPLL frequency synthesizer 100 includes digital control oscillator (DCO) 110, frequency divider 120, flip flop 130, phase comparator 140, loop filter 150, tracking varactor control sections 160 and 170, and frequency characteristic adjusting section 180. In ADPLL frequency synthesizer 100, frequency divider 120, flip flop 130, phase comparator 140, loop filter 150, and tracking varactor control sections 160 and 170 have basically the same configuration as the corresponding function sections of the ADPLL frequency synthesizer shown in FIG. 1.

Digitally controlled oscillator 110 includes inductor element 111, negative resistance element 112, varactor array 113, varactor array 114 and additional varactor 115. Inductor element 111, negative resistance element 112, varactor array 113 and varactor array 114 have basically the same configurations as the corresponding function sections of the ADPLL frequency synthesizer shown in FIG. 1.

Varactor array 113 and varactor array 114 are each constructed of a plurality of varactors (variable capacitance elements). The capacitance value of each varactor is the same value COTW.

The capacitance of varactor array 113 is controlled by an OTW integer signal received from tracking varactor control section 160. On the other hand, the capacitance of varactor array 114 is controlled by an OTW fract signal received from tracking varactor control section 170. Since the capacitances of varactor array 113 and varactor array 114 are controlled in this way, digitally controlled oscillator 110 can oscillate signals having frequencies corresponding to the capacitances.

Figure 3:
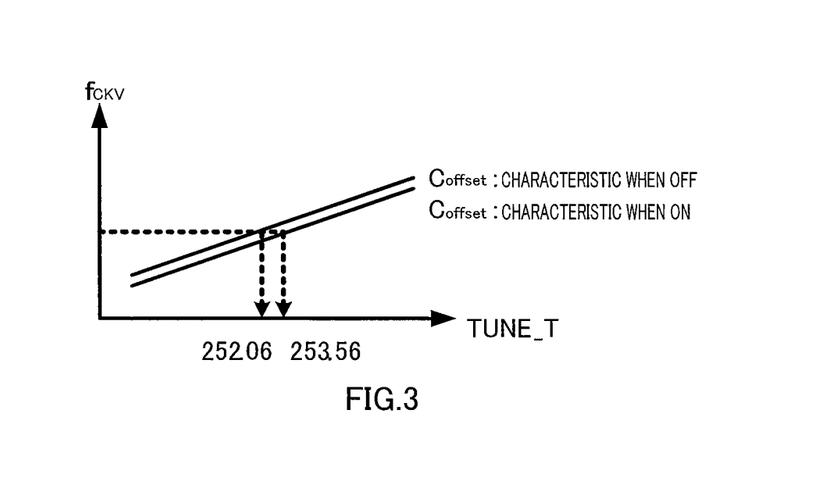
FIG. 3 is a diagram showing an oscillating frequency characteristic shift.

The capacitance value of additional varactor 115 changes based on an adjustment signal received from frequency characteristic adjusting section 180. When the capacitance value of additional varactor 115 changes, a basic characteristic of the oscillating frequency determined by the capacitances of varactor array 113 and varactor array 114 is shifted. Capacitance value Coffset of additional varactor 115 is preferably not an integral multiple of COTW and preferably satisfies, for example, Coffset=1.5 COTW or Coffset=0.5 COTW. In the present embodiment, suppose Coffset=1.5 COTW. That is, by performing binary control (on or off) Coffset, the above described basic characteristic is minutely shifted by an amount corresponding to 1.5 bits. For example, as shown in FIG. 3, when a target value of a DCO control signal TUNE_T corresponding to a target frequency of a DCO oscillating frequency fCKV when Coffset is turned off is 252.06, if Coffset is turned on, the target value of DCO control signal TUNE_T corresponding to the same target frequency is 253.56.

That is, the oscillating frequency fCKV of DCO 110 is expressed by equation 2 using a total capacitance value C of varactor array 113 and varactor array 114, inductance value L of inductor element 111 and capacitance value Coffset of additional varactor 115.

(Equation 2)

$$f_{CKV} = \frac{1}{2\pi\sqrt{L(C + C_{offset})}} \quad [2]$$

Frequency divider 120 frequency-divides an oscillation signal CKV of DCO 110 and outputs a CKVD to tracking varactor control section 170.

Flip flop 130 retimes a reference signal FREF with the CKV and outputs a CKR to tracking varactor control section 160.

Phase comparator 140 compares the phase of the reference signal FREF with the phase of the output signal CKV of DCO 110 and generates a phase error signal.

Loop filter 150 filters the phase error signal and outputs the filtered phase error signal as the DCO control signal TUNE_T.

Tracking varactor control section 160 converts the integer part of the DCO control signal TUNE_T to an OTW integer signal and outputs this OTW integer signal to varactor array 113 and thereby adjusts the capacitance of varactor array 113.

Tracking varactor control section 170 converts the fraction part of the DCO control signal TUNE_T to an OTW fract signal and outputs this OTW fract signal to varactor array 114 and thereby adjusts the capacitance of varactor array 114. Tracking varactor control section 170 includes a ΔΣ modulator.

As described above, phase comparator 140, loop filter 150, and tracking varactor control sections 160 and 170 control the capacitance values of varactor array 113 and varactor array 114 and thereby control the output frequency of DCO 110.

Frequency characteristic adjusting section 180 receives a PLL lock detection signal and the fraction part of the DCO control signal TUNE_T as input, compares a difference between the fraction part of the DCO control signal TUNE_T and an integer value closest thereto with a predetermined threshold and generates an adjustment signal based on the comparison result. That is, frequency characteristic adjusting section 180 decides whether the value of the DCO control signal TUNE_T is in the vicinity of an integer value or not after a lock detection and generates, upon deciding that the value is in the vicinity of the integer value, an OTWoffset which is a signal that controls the capacitance value of additional varactor 115. This adjustment signal is outputted to additional varactor 115, which causes additional varactor 115 to turn on or off to thereby adjust the basic characteristic of the transmission frequency determined by the capacitances of varactor array 113 and varactor array 114.

Figure 4:
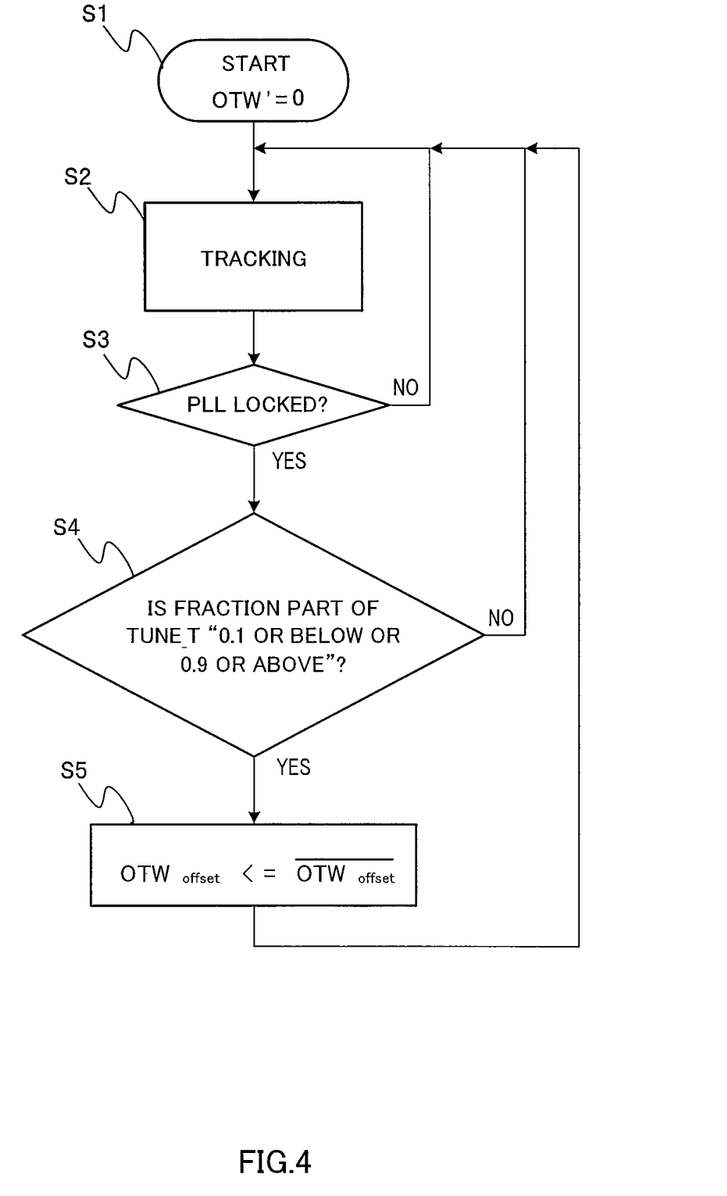
FIG. 4 is a flowchart illustrating operation of the ADPLL frequency synthesizer.

Operation of ADPLL frequency synthesizer 100 having the above described configuration will be described. FIG. 4 is a flowchart illustrating operation of ADPLL frequency synthesizer 100. As shown in FIG. 4, ADPLL frequency synthesizer 100 performs tracking operation until the Coffset turns off (S1) and the oscillating frequency of DCO 110 converges (PLL lock) to within a desired frequency range (that is, target range) first (S2, S3). When the PLL is locked, frequency characteristic adjusting section 180 decides whether the value of the fraction part of the DCO control signal TUNE_T is within a predetermined range or not (S4). When the value of the fraction part of the TUNE_T is not within the predetermined range, ADPLL frequency synthesizer 100 continues tracking while maintaining the Coffset off state. On the other hand, when the value of the fraction part of the TUNE_T is within the predetermined range, ADPLL frequency synthesizer 100 changes the Coffset from the off state to an on state (S5) and continues tracking.

In FIG. 4, the predetermined range in S4 in which the value of the TUNE_T is decided to be in the vicinity of an integer value is set to 1≦TUNE_T fraction part ≦1.1 or 1.9≦TUNE_T fraction part <2. That is, frequency characteristic adjusting section 180 compares a difference between the value of the fraction part and an integer value closest thereto with a predetermined threshold (here, 0.1).

FIG. 5 shows a simulation result of the operation of ADPLL frequency synthesizer 100. FIGS. 5A to 5F show time variation waveforms of TUNE_T Integer signal, TUNE_T Fract signal, OTW integer signal, OTW fract signal, OTW (total) and OTWoffset respectively. Furthermore, a secondary ΔΣ modulator is used for tracking varactor control section 170 here. As is obvious from FIG. 5C, integer values of 0 to 3 are instantaneously outputted in synchronization with the rising edge of the CKVD, but when viewed as a time average, a value including a decimal fraction is realized and the DCO oscillating frequency resolution is improved. Furthermore, the capacitance value Coffset of additional varactor 115 is 1.5 COTW.

Figure 5A:
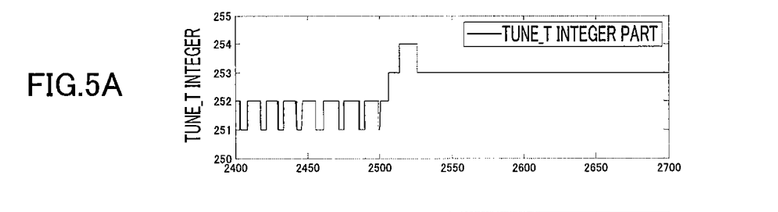
Figure 5B:
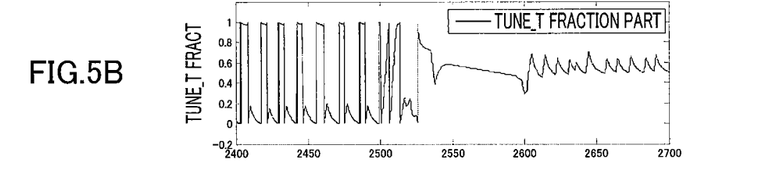
Figure 5C:
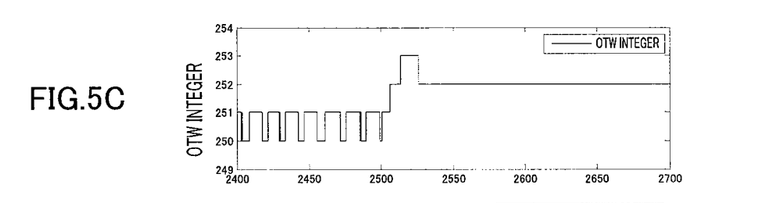
Figure 5D:
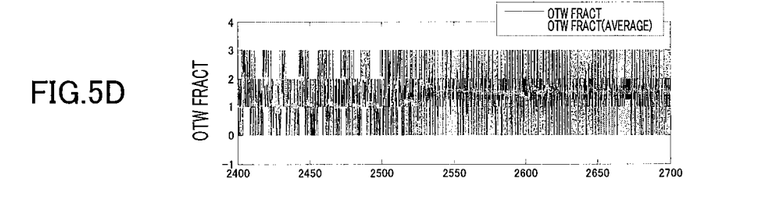
Figure 5E:
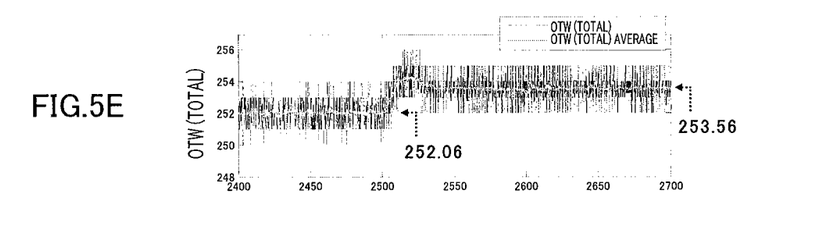
Figure 5F:
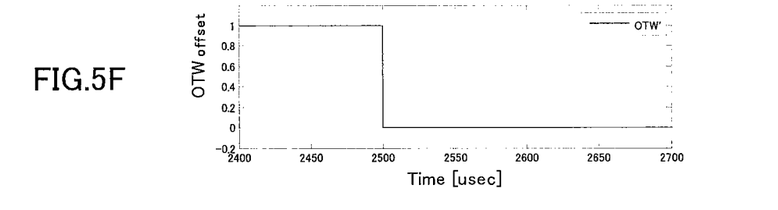
Figure 6A:
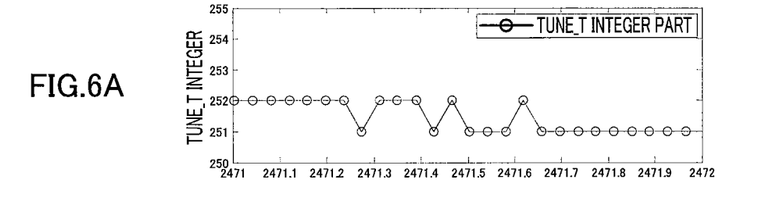
Figure 6B:
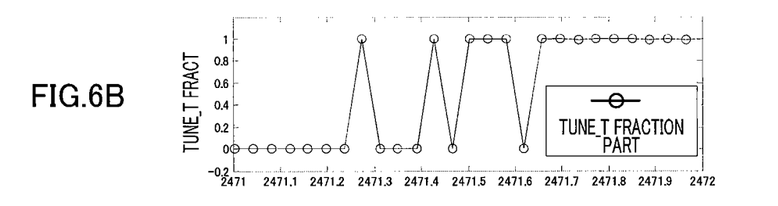
Figure 6C:
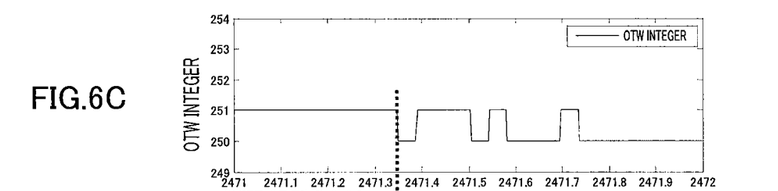
Figure 6D:
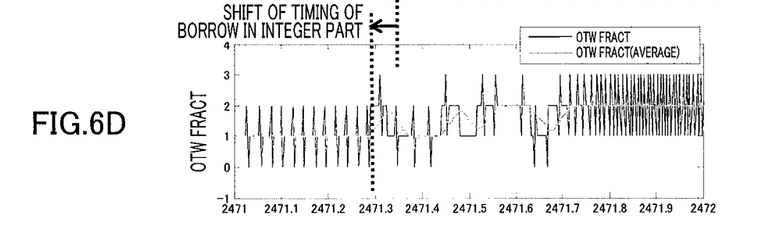
Figure 6E:
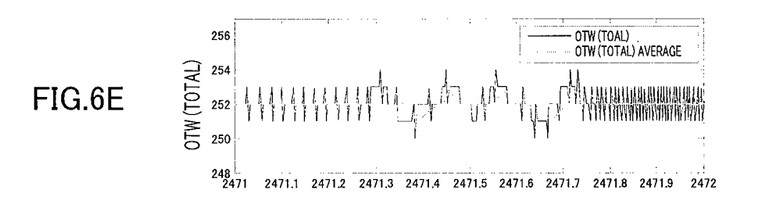
Figure 6F:
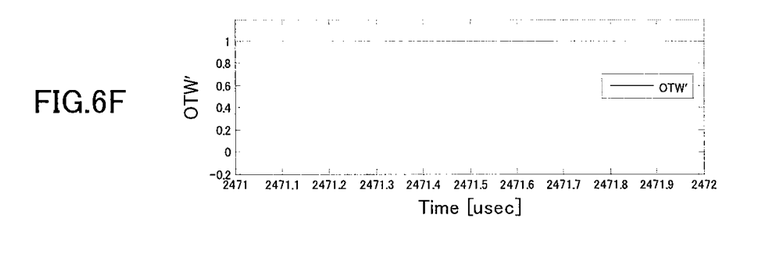

Before time 2500 usec, the target value of the DCO control signal TUNE_T is 252.06 and carries and borrows are repeated (see FIGS. 5A and 5C). To be more specific, before time 2500 usec, a phenomenon occurs in which an error between the actual value of the OTW (total) and the target value of the TUNE_T temporarily rises to the vicinity of ±2 when a carry or borrow takes place.

At time 2500 usec, the oscillating frequency characteristic of DCO 1 is changed by changing the OTWoffset from 1 to 0. That is, from time 2500 usec onward, the target value of the DCO control signal TUNE_T becomes 253.56. This eliminates carries and borrows and causes the OTW (total) to converge again approximately 100 usec after the OTWoffset changes (see FIG. 5E). From time 2600 usec onward after the re-convergence, the absolute value of the error between the value of the OTW (total) and the target value of the TUNE_T is stabilized within a maximum of on the order of ±1.5.

FIG. 6 is an enlarged view of the time zone (that is, time zone before time 2500 usec) where a carry or borrow occurs in FIG. 5. When the OTW integer (FIG. 6C) is compared with the OTW fract (FIG. 6D), it is clear that in the case of a carry or borrow, the change timing is shifted, and as a result, the error between the desired TUNE_T value and the OTW (total) is temporarily enlarged (see FIGS. 6A, 6B and 6E). As described above, this is attributable to the fact there are differences in the clock frequency and clock timing between tracking varactor control section 160 and tracking varactor control section 170.

Figure 7A:
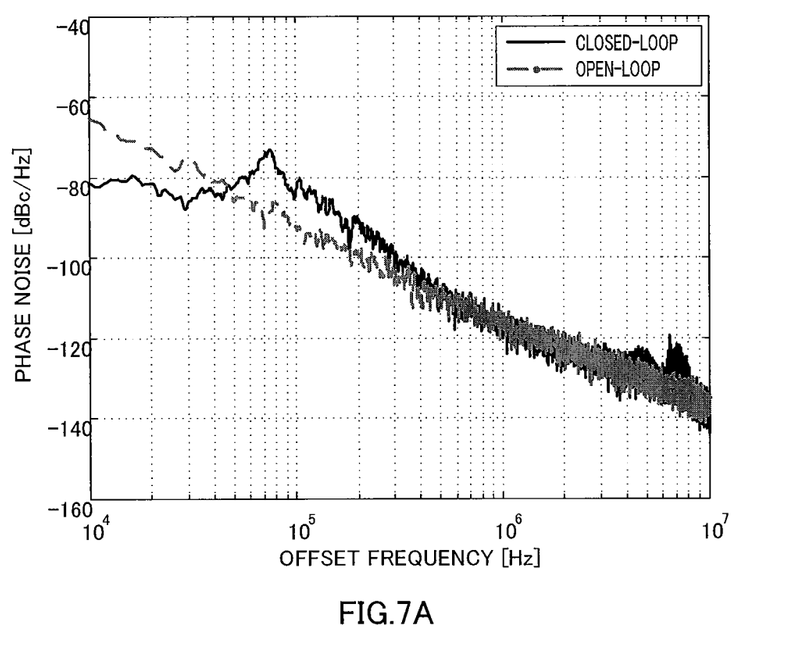
FIG. 7A-FIG.7B are diagram showing a calculation result of a phase noise characteristic.
Figure 7B:
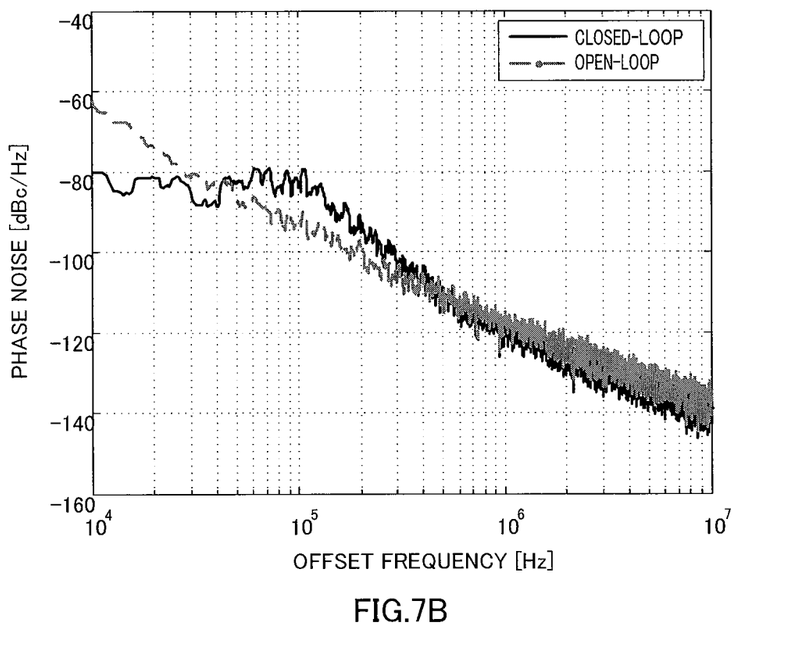

FIG. 7 is a diagram showing calculation results of phase noise characteristics. FIG. 7A is a phase noise characteristic calculated in a time zone in which a carry or borrow occurs in FIG. 5 (that is, time zone before time 2500 usec). On the other hand, FIG. 7B shows a phase noise characteristic calculated from time 2600 usec onward after the re-convergence in FIG. 5.

It is observed in FIG. 7A that phase noise characteristics (closed-loop) of the ADPLL deteriorates especially in a range farther than a 4-MHz offset. On the other hand, in FIG. 7B, as also shown in FIG. 5, the TUNE_T value converges stably and the deterioration in phase noise characteristics (closed-loop) as seen in FIG. 7A is not observed. That is, in ADPLL frequency synthesizer 100 according to the present embodiment, when it is decided that phase noise characteristics enters a range in which there is a high probability that a carry or borrow of the target value of the DCO control signal TUNE_T at the current point in time may occur, frequency characteristic adjusting section 180 performs control so as to shift the oscillating frequency characteristic, and can thereby prevent deterioration of phase noise characteristics. By the way, the open-loop phase noise characteristics in FIGS. 7A and B are completely the same and are shown together to make it easier to understand the differences of phase noise characteristic (closed-loop).

As described above, according to the present embodiment, in ADPLL frequency synthesizer 100, digitally controlled oscillator 110 as an oscillation section includes a first capacitance element group (varactor array 113) made up of a plurality of variable capacitance elements and a second capacitance element group (varactor array 114) made up of a plurality of variable capacitance elements, phase comparator 140, loop filter 150 and tracking varactor control sections 160 and 170 as an oscillating frequency control section generate a phase error signal corresponding to a difference between the phase of the output signal of digitally controlled oscillator 110 and the phase of a reference signal, control the capacitance value of varactor array 113 using an integer part of the phase error signal, also control the capacitance value of varactor array 114 using a fraction part of the phase error signal, and thereby control the output frequency of digitally controlled oscillator 110.

Furthermore, in ADPLL frequency synthesizer 100, frequency characteristic adjusting section 180 as an adjustment signal generation section compares a difference between the value of the fraction part of the DCO control signal TUNE_T and an integer value closest thereto with a predetermined threshold, generates an adjustment signal based on the comparison result and additional varactor 115 as a frequency characteristic shifting section shifts the oscillating frequency characteristic based on the adjustment signal received from frequency characteristic adjusting section 180.

Thus, by setting the predetermined threshold to a value defining a range with a high probability of the occurrence of a carry or borrow, it is possible to shift the oscillating frequency characteristic when the target value of the fraction part of the DCO control signal TUNE_T falls within the range with a high probability of the occurrence of a carry or borrow. Through the shift of the oscillating frequency characteristic, the target value of the fraction part of the DCO control signal TUNE_T can be shifted to a range with a low probability of the occurrence of a carry or borrow, and it is thereby possible to prevent phase noise characteristics of the ADPLL frequency synthesizer from deteriorating.

A case has been described above where frequency characteristic adjusting section 180 makes a decision using an instantaneous value of the DCO control signal TUNE_T when the PLL is locked. However, without being limited to this, frequency characteristic adjusting section 180 may also make a decision using an average value of the DCO control signal TUNE_T. By so doing, it is possible to prevent control misoperation due to erroneous output of an OTWoffset even when the value of the TUNE_T instantaneously enters a predetermined range decided to be in the vicinity of an integer value due to noise or the like.

Furthermore, the predetermined range need not be fixed, but may be changed according to the order of the ΔΣ modulator provided in tracking varactor control section 170 or CKV frequency.

Furthermore, a case has been described above where one additional varactor 115 is used as the section to shift the basic characteristic of the oscillating frequency. That is, the capacitance value Coffset of additional varactor 115 takes two values of 1.5 COTW and 0 under binary control.

By contrast, a modification example of the section that shifts the basic characteristic of the oscillating frequency may be used.

Figure 8:
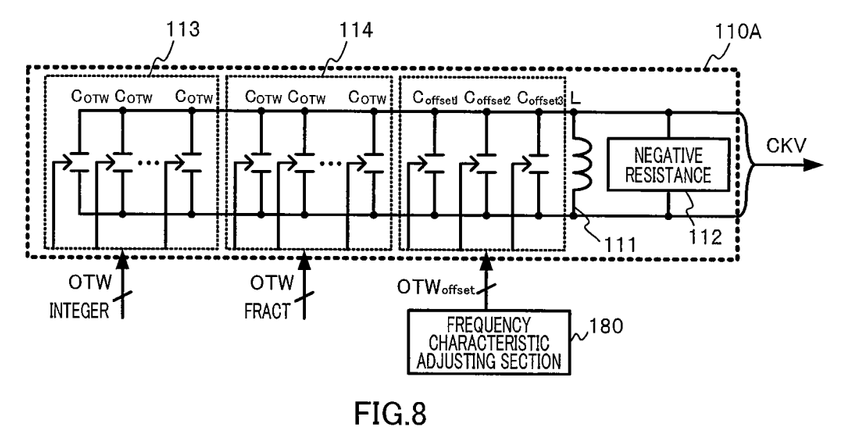
FIG. 8 is a diagram showing a modification example of a section that shifts a basic characteristic of the oscillating frequency.

As modification example 1, a plurality of additional varactors may be provided. FIG. 8 is a block diagram of DCO 110A when a plurality of additional varactors are provided. When, for example, the capacitances of three additional varactors included in DCO 110A are Coffset1=0.5 COTW, Coffset2=0.3 COTW and Coffset3=0.7 COTW, the following control over the transmission frequency characteristic may be performed. That is, when the value of the fraction part of the DCO control signal TUNE_T is a first predetermined range (1≦TUNE_T fraction part <1.1 or 1.9≦TUNE_T fraction part <2), the additional varactor having a capacitance of 0.5 COTW is turned on. Furthermore, in the case of a second predetermined range (1.1≦TUNE_T fraction part ≦1.25), the additional varactor of 0.3 COTW is turned on. Furthermore, in the case of a third predetermined range (1.75≦TUNE_T fraction part <1.9), the additional varactor of 0.7 COTW is turned on. By this means, the oscillating frequency characteristic may be controlled so that the fraction part of the target value of the DCO control signal is in the vicinity of 0.5. Adopting such multi-value control can further reduce the probability of the occurrence of a carry or borrow when the DCO control signal converges compared to the case with binary control.

Figure 9:
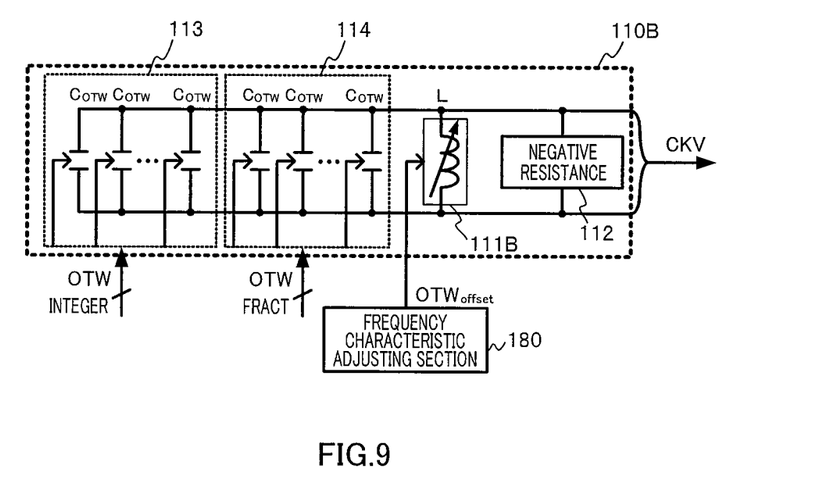
FIG. 9 is a diagram showing a modification example of a section that shifts a basic characteristic of the oscillating frequency.

As modification example 2, a variable inductance element may also be provided. FIG. 9 is a block diagram of DCO 110B provided with a variable inductance element. By controlling the inductance value of variable inductance element 111B using an OTWoffseT signal, it is possible to change the oscillating frequency. In this case, it is possible to change the oscillating frequency characteristic of DCO 110B by controlling only the variable inductance element, which will never lead to an increase of the chip area.

Furthermore, a case has been described above where frequency characteristic adjusting section 180 receives a lock detection signal from a lock detection section (not shown) as input and decides after a lock detection whether the value of the DCO control signal TUNE_T is within a predetermined range or not. Without being limited to this, frequency characteristic adjusting section 180 may recognize or estimate the target value of the DCO control signal TUNE_T after the lock detection before the lock detection without using a lock detection signal and decide whether the recognition value or estimate value is within a predetermined range or not. In this case, it is possible to realize a fast convergence to a target value of the DCO control signal in which a carry or borrow hardly occurs rather than changing the oscillating frequency characteristic of the DCO after a lock detection and changing the target value of the DCO control signal.

To estimate the target value of the DCO control signal TUNE_T after the lock detection before a lock detection, frequency characteristic adjusting section 180 may be provided with, for example, a register that stores an amount of change of the DCO control signal TUNE_T at a predetermined time interval so as to be able to estimate a target value of the DCO control signal TUNE_T from the amount of change.

Furthermore, to recognize a desired value of the DCO control signal TUNE_T after a lock detection before a lock detection, the target value of the DCO control signal TUNE_T for the oscillating frequency of the DCO when the additional varactor is turned on and turned off may be stored in a memory table and frequency characteristic adjusting section 180 may recognize the DCO control signal TUNE_T in accordance with a desired oscillating frequency with reference to the memory table.

A case has been described above where frequency characteristic adjusting section 180 is provided in the ADPLL frequency synthesizer, but without being limited to this, frequency characteristic adjusting section 180 may be provided on the communication apparatus side on which the ADPLL frequency synthesizer is mounted. In this case, an adjustment signal input terminal connected to an output terminal of frequency characteristic adjusting section 180 is provided on the input side of the additional varactor (or variable inductance element) when the ADPLL frequency synthesizer is mounted on the communication apparatus.

The disclosure of Japanese Patent Application No. 2009-124600, filed on May 22, 2009, including the specification, drawings and abstract, is incorporated herein by reference in its entirety.

INDUSTRIAL APPLICABILITY

The PLL frequency synthesizer of the present invention is suitable for use in improving a phase noise characteristic.

REFERENCE SIGNS LIST

100 ADPLL frequency synthesizer
110 Digitally controlled oscillator
111 Inductor element
112 Negative resistance element
113, 114 Varactor array
115 Additional varactor
120 Frequency divider
130 Flip flop
140 Phase comparator
150 Loop filter
160, 170 Tracking varactor control section
180 Frequency characteristic adjusting section

The invention claimed is:

1. A phase locked loop frequency synthesizer, comprising:
an oscillation section that includes a first capacitance element group made up of a plurality of variable capacitance elements and a second capacitance element group made up of a plurality of variable capacitance elements; and
an oscillating frequency control section that controls an output frequency of the oscillation section by generating a phase error signal corresponding to a difference between a phase of an output signal of the oscillation section and a phase of a reference signal, controlling a capacitance value of the first capacitance element group using an integer part of the phase error signal, and controlling a capacitance value of the second capacitance element group using a fraction part of the phase error signal,
wherein the phase locked loop frequency synthesizer comprises:
a frequency characteristic adjusting section that generates an adjustment signal based on a result of a comparison between a difference between the value of the fraction part and an integer value closest to the value of the fraction part and a predetermined threshold; and
a frequency characteristic shifting section provided in the oscillation section that shifts an oscillating frequency characteristic of the oscillation section based on the adjustment signal.

2. The phase locked loop frequency synthesizer according to claim 1, wherein:
the frequency characteristic shifting section comprises a variable capacitance element; and
a capacitance value of the variable capacitance element changes based on the adjustment signal.

3. The phase locked loop frequency synthesizer according to claim 2,
wherein the capacitance value of the variable capacitance element is set to a value that is not an integral multiple of the capacitance values of the variable capacitance elements making up the first capacitance element group and the second capacitance element group.

4. The phase locked loop frequency synthesizer according to claim 1, wherein:
the frequency characteristic shifting section comprises a plurality of capacitance elements;
the capacitance values of the plurality of capacitance elements differ from each other; and
at least one of the plurality of capacitance elements turns on based on the adjustment signal.

5. The phase locked loop frequency synthesizer according to claim 1,
wherein the frequency characteristic adjusting section changes the predetermined threshold based on an order of a digital sigma modulator included in the oscillating frequency control section or an output frequency of the oscillation section.

6. The phase locked loop frequency synthesizer according to claim 1, wherein:
the frequency characteristic shifting section comprises a variable inductor element; and
an inductance value of the variable inductor element changes based on the adjustment signal.

7. The phase locked loop frequency synthesizer according to claim 1, wherein:
the frequency characteristic adjusting section performs a specific comparison of whether at least one of following two inequalities is satisfied,
$0 \leq$ the value of the fraction part $\leq$ a predetermined first threshold
a predetermined second threshold $\leq$ the value of the fraction part $<1$
where the second threshold is greater than the first threshold; and
generates the adjustment signal based on a result of the specific comparison.

8. The phase locked loop frequency synthesizer according to claim 1, wherein:

the oscillating frequency control section controls the capacitance value of the first capacitance element group in synchronization with a first clock signal, and controls the capacitance value of the second capacitance element group in synchronization with a second clock signal that is different from the first clock signal;

the frequency characteristic adjusting section inputs a PLL lock detection signal, and generates the adjustment signal based on the result of the comparison only when the phase locked loop frequency synthesizer is locked; and the frequency characteristic adjusting section does not input the first clock signal and the second clock signal.

\* \* \* \* \*